(12) United States Patent
Yoshino et al.

(10) Patent No.: US 10,096,517 B2
(45) Date of Patent: Oct. 9, 2018

(54) WAFER PROCESSING METHOD

(71) Applicant: DISCO CORPORATION, Tokyo (JP)

(72) Inventors: Tomoki Yoshino, Tokyo (JP); Takumi Shotokuji, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/434,311

(22) Filed: Feb. 16, 2017

(65) Prior Publication Data
US 2017/0243786 A1 Aug. 24, 2017

(30) Foreign Application Priority Data

Feb. 18, 2016 (JP) .................................. 2016-028673

(51) Int. Cl.
| | |
|---|---|
| *H01L 21/78* | (2006.01) |
| *H01L 21/268* | (2006.01) |
| *H01L 21/304* | (2006.01) |
| *H01L 21/683* | (2006.01) |
| *H01L 21/67* | (2006.01) |

(52) U.S. Cl.
CPC ............ *H01L 21/78* (2013.01); *H01L 21/268* (2013.01); *H01L 21/304* (2013.01); *H01L 21/67092* (2013.01); *H01L 21/6836* (2013.01); *H01L 2221/68327* (2013.01)

(58) Field of Classification Search
CPC ... H01L 21/78; H01L 21/304; H01L 21/6836; H01L 21/268; H01L 2221/68327

USPC ........................................................ 438/462
See application file for complete search history.

(56) References Cited

U.S. PATENT DOCUMENTS

| | | | | |
|---|---|---|---|---|
| 2005/0170616 | A1* | 8/2005 | Murata | ............... H01L 21/3043 438/463 |
| 2008/0220591 | A1* | 9/2008 | Nakamura | .......... H01L 21/6835 438/464 |
| 2012/0100694 | A1* | 4/2012 | Kajiyama | ............... H01L 21/78 438/462 |

FOREIGN PATENT DOCUMENTS

JP          2014-221483          11/2014

\* cited by examiner

*Primary Examiner* — Fernando L Toledo
*Assistant Examiner* — Adam S Bowen
(74) *Attorney, Agent, or Firm* — Greer Burns & Crain Ltd.

(57) ABSTRACT

Disclosed herein is a wafer processing method for dividing a wafer into individual device chips along division lines. The wafer processing method includes a frame supporting step of attaching the wafer to an adhesive tape fixed at its peripheral portion to an annular frame, thereby supporting the wafer through the adhesive tape to the annular frame, a laser processing step of applying a laser beam to each division line to thereby form a strength reduced portion along each division line, and a dividing step of applying a radial tension to the adhesive tape and next applying an external force to the wafer in the condition where the radial tension is kept acting on the adhesive tape, thereby dividing the wafer into the individual device chips along the division lines.

6 Claims, 8 Drawing Sheets

WAFER PROCESSING METHOD

BACKGROUND OF THE INVENTION

Field of the Invention

The present invention relates to a wafer processing method for dividing a wafer along a plurality of division lines, the front side of the wafer being partitioned by the division lines to define a plurality of separate regions where a plurality of devices are formed.

Description of the Related Art

There is disclosed in Japanese Patent Laid-open No. 2014-221483 a method of dividing a wafer along a plurality of division lines, the front side of the wafer being partitioned by the division lines to define a plurality of separate regions where a plurality of devices such as integrated circuits (ICs), large-scale integrations (LSIs), and light-emitting diodes (LEDs) are formed. In this method, the wafer is first attached to an adhesive tape fixed at its peripheral portion to a frame, thereby supporting the wafer through the adhesive tape to the frame. Thereafter, a pulsed laser beam having a transmission wavelength to the wafer is applied along each division line in the condition where the focal point of the pulsed laser beam is set inside the wafer, thereby forming a strength reduced portion along each division line. Thereafter, a radial tension is applied to the adhesive tape attached to the wafer, thereby dividing the wafer along the division lines to obtain individual device chips.

SUMMARY OF THE INVENTION

The method disclosed in Japanese Patent Laid-open No. 2014-221483 has the following problem. In dividing the wafer into the individual device chips along the division lines, there is a possibility that the distance between any adjacent ones of the device chips may be locally reduced to cause the contact of the adjacent device chips, so that the device chips may be damaged.

It is therefore an object of the present invention to provide a wafer processing method which can prevent damage to the individual device chips due to the contact of the device chips in dividing the wafer into the device chips along the division lines.

In accordance with an aspect of the present invention, there is provided a wafer processing method for dividing a wafer into a plurality of individual device chips along a plurality of crossing division lines formed on the front side of the wafer, the front side of the wafer being partitioned by the division lines to define a plurality of separate regions where a plurality of devices are formed, the individual device chips corresponding to the respective devices, the wafer processing method including a frame supporting step of attaching the wafer to an adhesive tape fixed at its peripheral portion to an annular frame, thereby supporting the wafer through the adhesive tape to the annular frame; a laser processing step of applying a laser beam to each division line to thereby form a strength reduced portion along each division line; and a dividing step of applying a radial tension to the adhesive tape and next applying an external force to the wafer in the condition where the radial tension is kept acting on the adhesive tape, thereby dividing the wafer into the individual device chips along the division lines.

Preferably, the back side of the wafer is attached to the adhesive tape in the frame supporting step. Preferably, the dividing step includes the steps of placing the wafer on a soft member and next rolling a roller on the wafer placed on the soft member, thereby applying the external force to the wafer. Preferably, the dividing step includes the steps of setting a first ring having a cylindrical inner surface on one side of the adhesive tape, setting a second ring having a cylindrical outer surface on the other side of the adhesive tape, the cylindrical outer surface of the second ring corresponding to the cylindrical inner surface of the first ring, and next sandwiching the adhesive tape between the cylindrical inner surface of the first ring and the cylindrical outer surface of the second ring, thereby applying the radial tension to the adhesive tape. Preferably, the laser processing step includes the steps of setting the focal point of the laser beam inside the wafer, the laser beam having a transmission wavelength to the wafer, and next applying the laser beam along each division line, thereby forming a modified layer as the strength reduced portion inside the wafer along each division line. As another case, the laser processing step includes the steps of setting the focal point of the laser beam inside the wafer, the laser beam having a transmission wavelength to the wafer, and next applying the laser beam along each division line, thereby forming shield tunnels as the strength reduced portion along each division line. As still another case, the laser processing step includes the steps of setting the focal point of the laser beam on the upper surface of the wafer, the laser beam having an absorption wavelength to the wafer, and next applying the laser beam along each division line, thereby forming a laser processed groove as the strength reduced portion on the upper surface of the wafer along each division line.

According to the wafer processing method of the present invention, in dividing the wafer into the individual device chips along the division lines, a radial tension is kept acting on the adhesive tape, so that there is no possibility that the distance between any adjacent ones of the device chips may be reduced by the application of an external force to the wafer. Accordingly, it is possible to prevent damage to the device chips due to the contact of the device chips in dividing the wafer.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
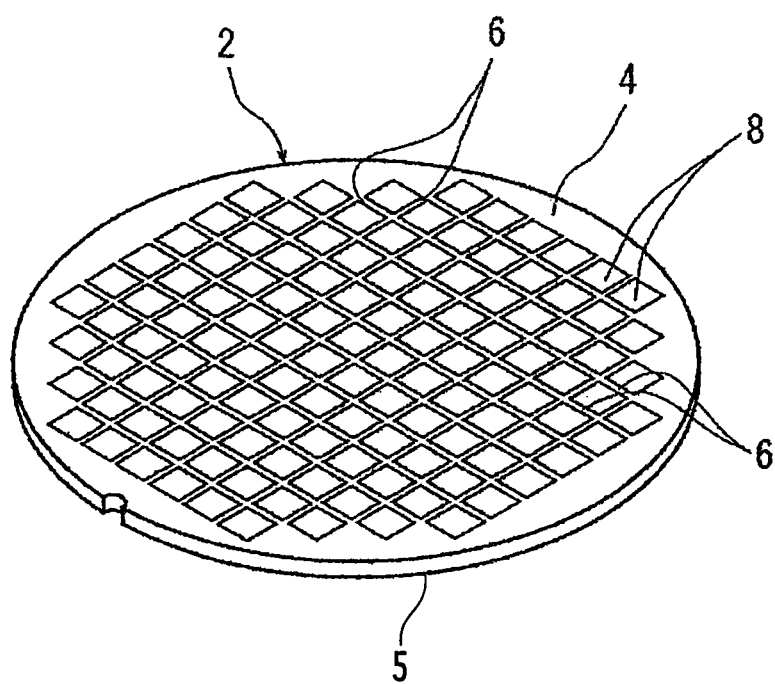
FIG. 1 is a perspective view of a wafer.
Figure 2:
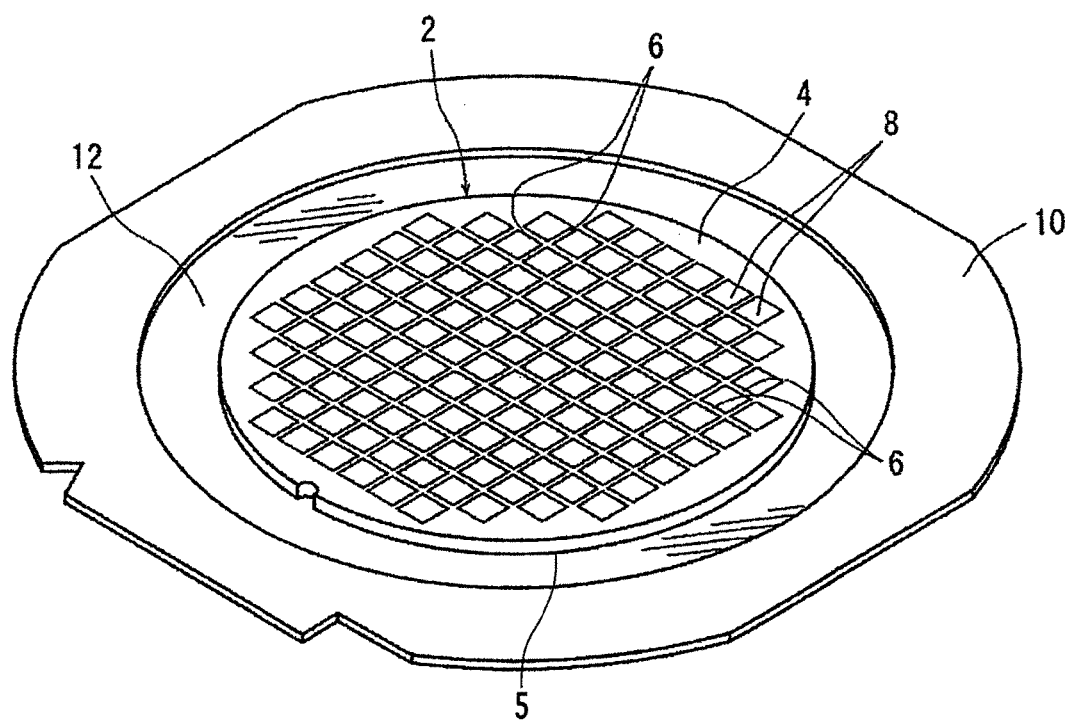
FIG. 2 is a perspective view showing the condition that the wafer shown in FIG. 1 is supported through an adhesive tape to an annular frame.

A preferred embodiment of the wafer processing method according to the present invention will now be described with reference to the drawings. Referring to FIG. 1, there is shown a circular wafer 2 formed of silicon, sapphire, silicon carbide, or gallium nitride, for example. The wafer 2 has a front side 4 and a back side 5 opposite to the front side 4. A plurality of crossing division lines 6 are formed on the front side 4 of the wafer 2 to thereby define a plurality of separate regions on the front side 4 of the wafer 2. A plurality of devices 8 such as ICs, LSIs, and LEDs are formed in these plural separate regions. Referring to FIG. 2, there are shown an annular frame 10 and a circular adhesive tape 12 fixed to the annular frame 10. The annular frame 10 may be formed of a metal material such as steel, and the adhesive tape 12 may be formed of a resin material such as polyolefin and polyvinyl chloride (PVC). The inner circumference of the annular frame 10 is preferably circular. As shown in FIG. 2, the adhesive tape 12 is attached at its peripheral portion to the annular frame 10, thereby fixing the adhesive tape 12 to the annular frame 10. In performing the wafer processing method of the present invention, a frame supporting step is first performed in such a manner that the wafer 2 is attached to the adhesive tape 12 to thereby support the wafer 2 through the adhesive tape 12 to the annular frame 10. In this preferred embodiment, the back side 5 of the wafer 2 is attached to the adhesive tape 12 as shown in FIG. 2, wherein the devices 8 are not formed on the back side 5 of the wafer 2.

Figure 3:
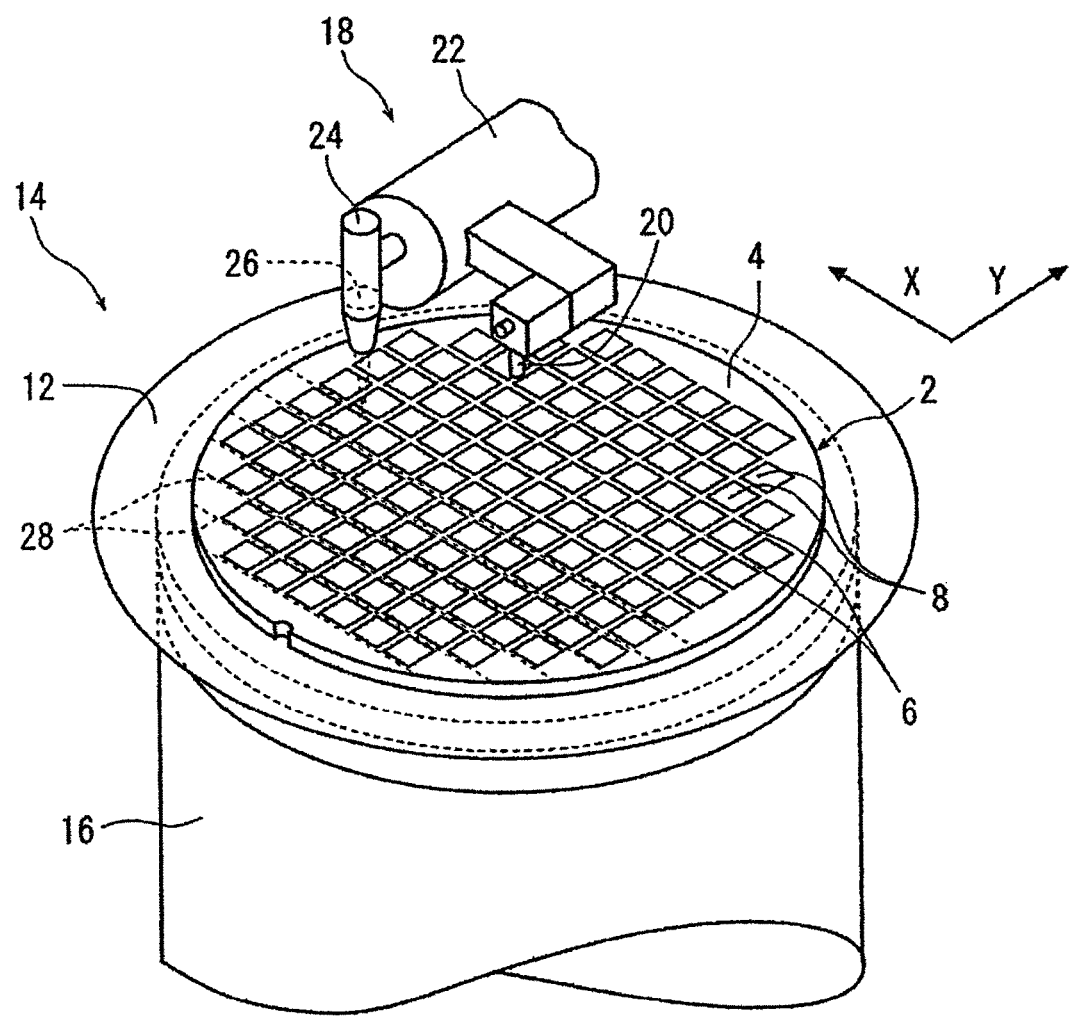
FIG. 3 is a perspective view showing a laser processing step.

After performing the frame supporting step, a laser processing step is performed in such a manner that a laser beam is applied to each division line 6 to thereby form a strength reduced portion along each division line 6. This laser processing step may be performed by using a laser processing apparatus 14, a part of which is shown in FIG. 3. The laser processing apparatus 14 includes a chuck table 16, laser beam applying means 18, imaging means 20, and control means (not shown).

The chuck table 16 has a circular upper surface as a substantially horizontal surface for holding the wafer 2. The upper surface of the chuck table 16 is formed of a porous material, and it is connected through a suction passage to any suction means (not shown). The chuck table 16 is rotatable by any rotating means (not shown). Further, the chuck table 16 is movable both in an X direction by first moving means (not shown) and in a Y direction by second moving means (not shown). The X direction is defined as the direction shown by an arrow X in FIG. 3, and the Y direction is defined as the direction shown by an arrow Y in FIG. 3, which is perpendicular to the X direction in an XY plane. The XY plane defined by the X direction and the Y direction is a substantially horizontal plane.

The laser beam applying means 18 includes a casing 22 extending in a substantially horizontal direction, pulsed laser beam oscillating means (not shown) built in the casing 22, focusing means 24 provided at the front end of the casing 22, and focal position adjusting means (not shown). Although not shown, the pulsed laser beam oscillating means includes a pulsed laser oscillator for oscillating a pulsed laser beam, adjusting means for adjusting the power of the pulsed laser beam, and setting means for setting the repetition frequency of the pulsed laser beam. The focusing means 24 includes a focusing lens 26 for focusing the pulsed laser beam oscillated from the pulsed laser beam oscillating means.

The imaging means 20 is provided at the front end portion of the casing 22 so as to be spaced from the focusing means 24. The imaging means 20 includes an imaging device (not shown) such as charge-coupled device (CCD) for imaging the wafer 2 as a workpiece. An image signal obtained by the imaging means 20 is output to the control means configured by a computer.

In performing the laser processing step, the wafer 2 supported through the adhesive tape 12 to the annular frame 10 is placed on the upper surface of the chuck table 16 in the condition where the front side 4 of the wafer 2 is oriented upward. Thereafter, the suction means is operated to apply a vacuum to the upper surface of the chuck table 16, thereby holding the back side 5 of the wafer 2 through the adhesive tape 12 on the upper surface of the chuck table 16 under suction. The annular frame 10 (not shown in FIG. 3) is fixed by a plurality of clamps (not shown) provided on the outer circumference of the chuck table 16. Thereafter, the first moving means is operated to move the chuck table 16 to the position below the imaging means 20. In this condition, the imaging means 20 and the control means perform image processing such as pattern matching for making the alignment between the plural division lines 6 and the focusing means 24. Thus, an alignment operation for detecting a laser beam applying position is performed. Thereafter, the first moving means is operated again to move the chuck table 16 to the position below the focusing means 24 so that one end of a predetermined one of the division lines 6 is positioned directly below the focusing means 24. Thereafter, the focal position adjusting means is operated to vertically move the focusing means 24, thereby adjusting the focal point of the pulsed laser beam to a predetermined position in the thickness direction of the wafer 2. Thereafter, the laser beam applying means 18 is operated to apply the pulsed laser beam from the focusing means 24 to the predetermined division line 6. At the same time, the first moving means is operated to move the chuck table 16 in the X direction at a predetermined feed speed. When the other end of the predetermined division line 6 has reached the position directly below the focusing means 24, the operation of the laser beam applying means 18 and the first moving means is stopped. As a result, a strength reduced portion 28 is formed along the predetermined division line 6. Thereafter, the above laser processing is similarly performed along all the other division lines 6 to thereby form a plurality of similar strength reduced portions 28 along all the other division lines 6.

In performing the laser processing step, for example, a modified layer may be formed as each strength reduced portion 28 inside the wafer 2 along each division line 6. The modified layer along each division line 6 may be formed under the following processing conditions by applying a laser beam having a transmission wavelength to the wafer 2 along each division line 6 in the condition where the focal point of the laser beam is set inside the wafer 2.

Wavelength of the laser beam: 1340 nm
Average power: 0.5 W
Repetition frequency: 50 kHz
Focused spot diameter: 1 μm
Work feed speed: 50 mm/second As another example, a plurality of shield tunnels extending in the thickness direction of the wafer 2 may be formed as each strength reduced portion 28 along each division line 6. Each shield tunnel is composed of a fine hole extending from the upper surface of the wafer 2 (the front side 4 in the condition where the wafer 2 is placed on the chuck table 16) to the focal point set inside the wafer 2 and an amorphous portion formed around the fine hole. For example, the fine hole has a diameter of approximately 1 μm, and the amorphous portion has a diameter of approximately 10 μm. The plural shield tunnels may be formed at given intervals (e.g., approximately 10 μm) along each division line 6 or may be continuously formed along each division line 6 in such a manner that the amorphous portions of any adjacent ones of the plural shield tunnels are overlapped each other. The plural shield tunnels along each division line 6 may be formed under the following processing conditions by applying a laser beam having a transmission wavelength to the wafer 2 along each division line 6 in the condition where the focal point of the laser beam is set inside the wafer 2. Preferably, the focal point of the laser beam is set at a position near the lower surface (back side 5) of the wafer 2 opposite to the upper surface (front side 4) of the wafer 2 to which the laser beam is applied. In the following processing conditions, "refractive index" means the refractive index of the wafer 2, and "numerical aperture" means the numerical aperture of the focusing lens 26 of the focusing means 24.

Wavelength of the laser beam: 1030 nm
Average power: 3 W
Repetition frequency: 50 kHz
Focused spot diameter: 10 μm
Refractive index/numerical aperture: 0.05 to 0.2
Work feed speed: 500 mm/second As still another example, a laser processed groove may be formed as each strength reduced portion 28 on the upper surface of the wafer 2 along each division line 6. The laser processed groove along each division line 6 may be formed under the following processing conditions by applying a laser beam having an absorption wavelength to the wafer 2 along each division line 6 in the condition where the focal point of the laser beam is set on the upper surface of the wafer 2, thereby performing ablation of the upper surface of the wafer 2.

Figure 4:
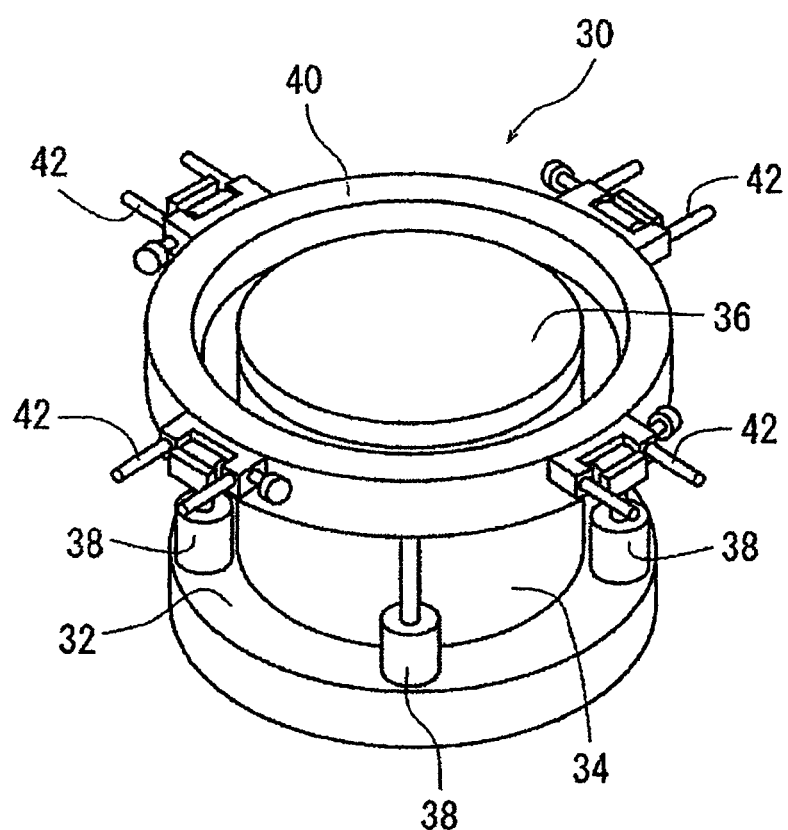
FIG. 4 is a perspective view of a tension producing apparatus.

Wavelength of the laser beam: 355 nm
Average power: 5 W
Repetition frequency: 50 kHz
Focused spot diameter: 10 μm
Work feed speed: 100 mm/second After performing the laser processing step, a dividing step is performed in such a manner that an external force is applied to the wafer 2 in the condition where a radial tension is kept acting on the adhesive tape 12, thereby dividing the wafer 2 into the individual devices 8 (individual device chips) along the division lines 6. The radial tension may be applied to the adhesive tape 12 by using a tension producing apparatus 30 shown in FIG. 4. The tension producing apparatus 30 includes a disk-shaped base 32 and a cylindrical support 34 extending upward from the upper surface of the base 32. A disk-shaped soft member 36 is fixed to the upper surface of the support 34. For example, the soft member 36 is formed of a synthetic rubber. The diameter of the soft member 36 is substantially the same as the diameter of the support 34. The diameter of the soft member 36 is greater than the diameter of the wafer 2 and less than the inner diameter of the annular frame 10. As shown in FIG. 4, the outer diameter of the base 32 is greater than the outer diameter of the support 34, so that the upper surface of the peripheral portion of the base 32 is exposed upward. A plurality of air cylinders 38 extend vertically from the upper surface of the peripheral portion of the base 32 so as to be spaced in the circumferential direction. An annular elevating member 40 is connected to the upper ends of all the air cylinders 38. The inner diameter and outer diameter of the annular elevating member 40 correspond to the inner diameter and outer diameter of the annular frame 10, respectively. Further, an annular spacing is defined between the inner circumferential surface of the annular elevating member 40 and the outer circumferential surfaces of the support 34 and the soft member 36. A plurality of clamps 42 are provided on the outer circumference of the annular elevating member 40 so as to be spaced in the circumferential direction.

Figure 5A:
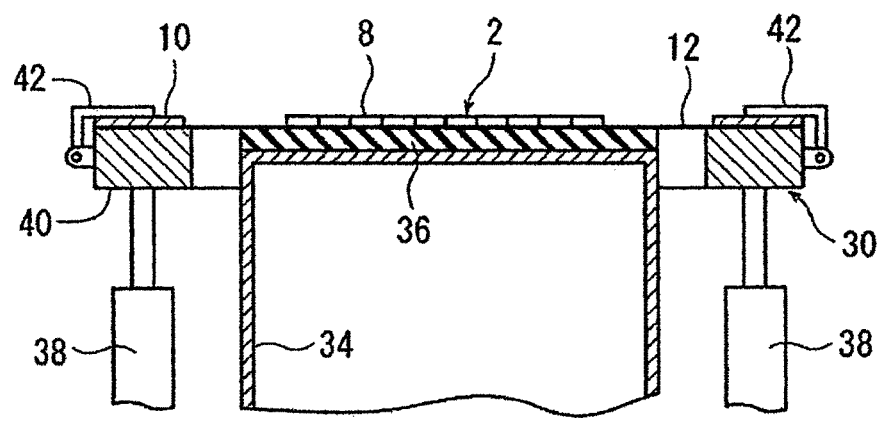
FIGS. 5A and 5B are sectional views showing the condition that the tension producing apparatus shown in FIG. 4 is operated to apply a radial tension to the adhesive tape.
Figure 5B:
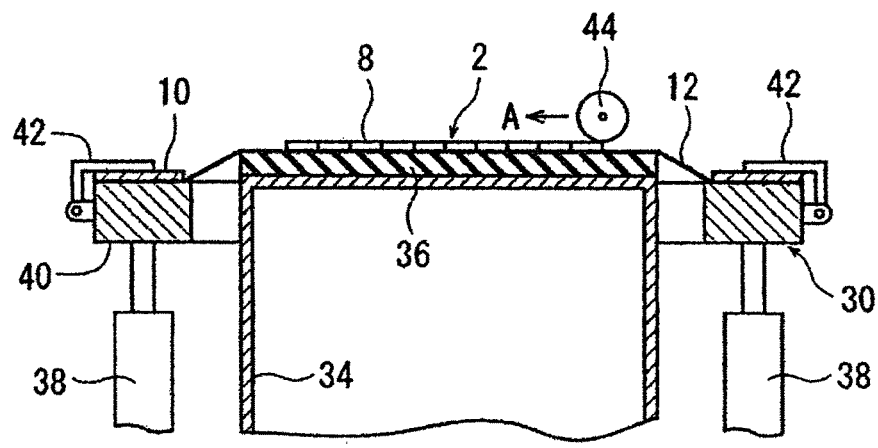
Figure 6:
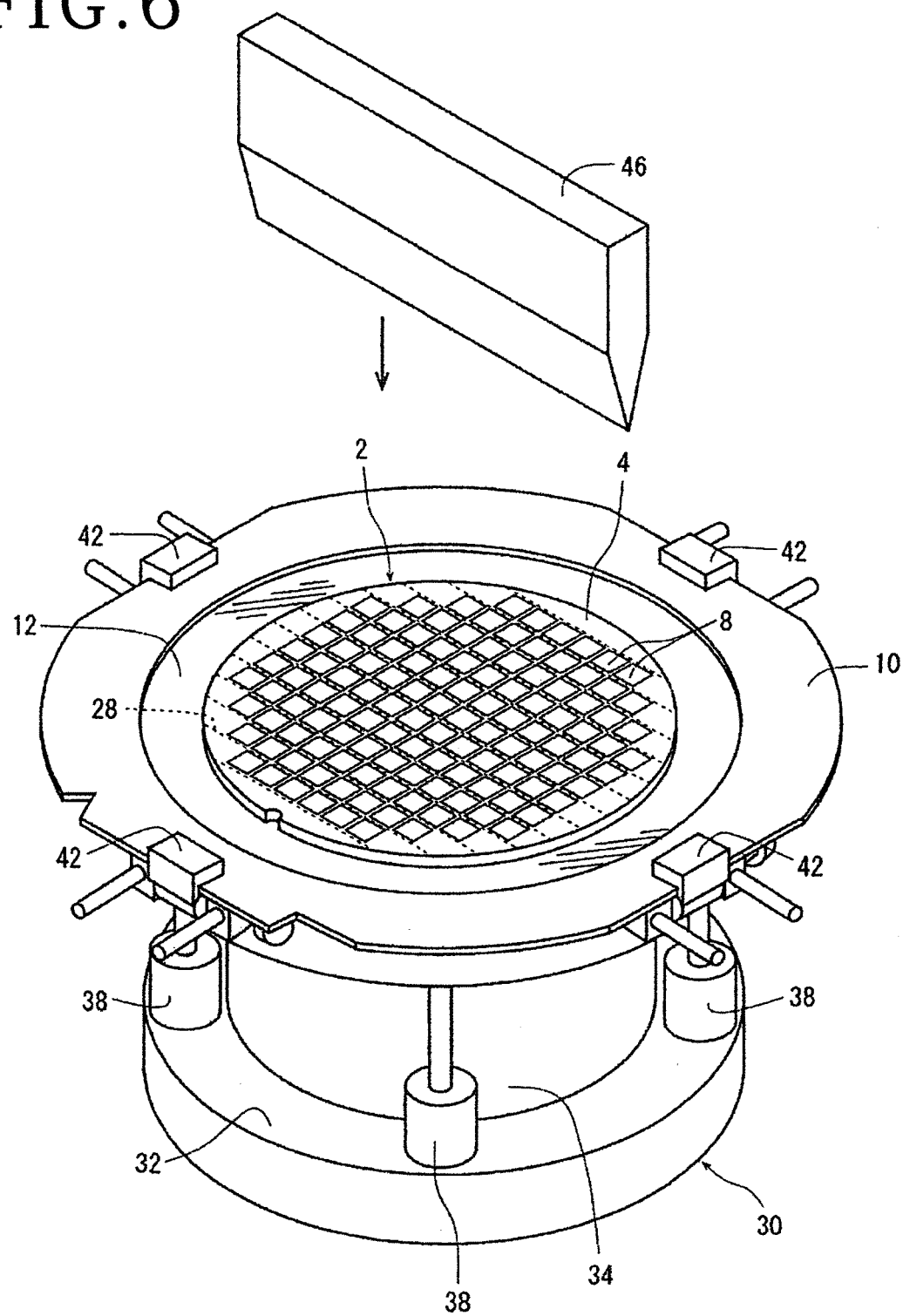
FIG. 6 is a perspective view showing a dividing step of dividing the wafer into individual device chips along each division line where a strength reduced portion is formed, by using a wedge member.

In performing the dividing step by using the tension producing apparatus 30, each air cylinder 38 is first operated to make the level of the upper surface of the annular elevating member 40 equal to the level of the upper surface of the soft member 36. Thereafter, the wafer 2 is placed through the adhesive tape 12 on the upper surface of the soft member 36 in the condition where the front side 4 of the wafer 2 is oriented upward as shown in FIG. 5A. At the same time, the annular frame 10 is placed through the adhesive tape 12 on the upper surface of the annular elevating member 40 and next fixed to the annular elevating member 40 by the plural clamps 42 as shown in FIG. 5A. Thereafter, as shown in FIG. 5B, each air cylinder 38 is operated to lower the annular elevating member 40 to a predetermined level. As a result, the annular frame 10 is also lowered together with the annular elevating member 40, thereby applying a radial tension to the adhesive tape 12 fixed at its peripheral portion to the annular frame 10. At this time, the radial tension is set to such a degree that it does not divide the wafer 2 into the individual device chips. In the condition where the radial tension is kept acting on the adhesive tape 12, an external force is applied to the wafer 2 to thereby divide the wafer 2 into the individual device chips along the division lines 6. For example, the application of the external force may be realized by using a resin roller 44 as shown in FIG. 5B. More specifically, the resin roller 44 may be rolled on the front side 4 of the wafer 2 in the direction shown by an arrow A in FIG. 5B, thereby applying a downward force to the wafer 2 to divide the wafer 2 along the division lines 6. As a modification, the application of the external force may be realized by using a metal wedge member 46 as shown in FIG. 6. More specifically, the metal wedge member 46 may be pressed on each division line 6 to thereby divide the wafer 2 along each division line 6.

Figure 7:
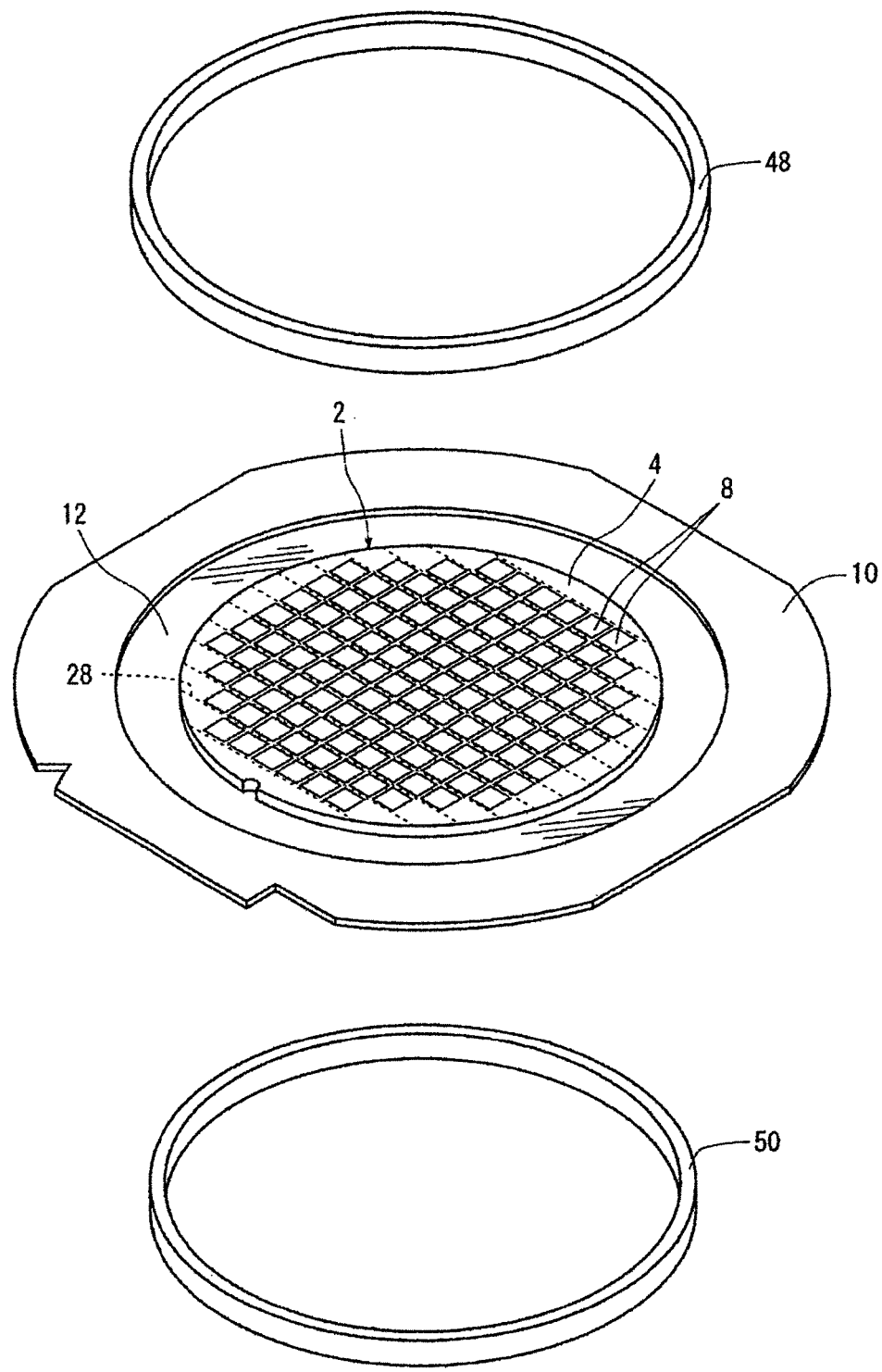
FIG. 7 is a perspective view showing a first ring and a second ring.

As a modification of the method of applying the radial tension to the adhesive tape 12 in the dividing step, a first ring 48 and a second ring 50 smaller in size than the first ring 48 may be used as shown in FIG. 7. Both the first ring 48 and the second ring 50 are annular in shape. The first ring 48 has a cylindrical inner surface and the second ring 50 has a cylindrical outer surface corresponding to the cylindrical inner surface of the first ring 48. The inner diameter of the first ring 48 and the inner diameter of the second ring 50 are both larger than the diameter of the wafer 2. The outer diameter of the first ring 48 and the outer diameter of the second ring 50 are both smaller than the inner diameter of the annular frame 10. The inner diameter of the first ring 48 is slightly larger than the outer diameter of the second ring 50.

Figure 8:
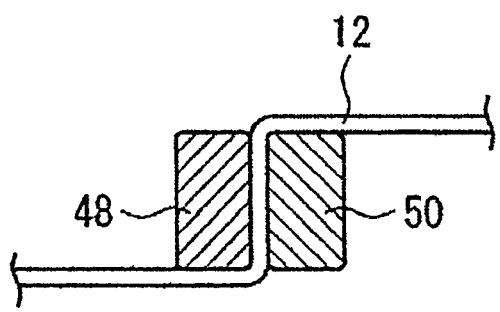
FIG. 8 is a sectional view showing the condition that the first ring and the second ring shown in FIG. 7 are used to apply a radial tension to the adhesive tape.

In performing the dividing step by using the first ring 48 and the second ring 50, the first ring 48 is first set on one side (upper surface as viewed in FIG. 7) of the adhesive tape 12 in its annular area exposed between the wafer 2 and the annular frame 10. Similarly, the second ring 50 is set on the other side (lower surface as viewed in FIG. 7) of the adhesive tape 12 in its annular area exposed between the wafer 2 and the annular frame 10 so as to be positioned inside the first ring 48 as viewed in plan. Thereafter, as shown in FIG. 8, the first ring 48 and the second ring 50 are pressed against the adhesive tape 12 until the adhesive tape 12 is sandwiched between the cylindrical inner surface of the first ring 48 and the cylindrical outer surface of the second ring 50. As a result, a radial tension is applied to the adhesive tape 12 fixed at its peripheral portion to the annular frame 10. Also in this case, the radial tension is set to such a degree that it does not divide the wafer 2 into the individual device chips as similar to the case of using the tension producing apparatus 30 mentioned above. In the condition where the radial tension is kept acting on the adhesive tape 12, an external force is applied to the wafer 2 to thereby divide the wafer 2 into the individual device chips along the division lines 6. The application of the external force may be realized by using the roller 44 shown in FIG. 5B or the wedge member 46 shown in FIG. 6 as similar to the case of using the tension producing apparatus 30 mentioned above.

In dividing the wafer 2 along the division lines 6 in the dividing step, a radial tension is kept acting on the adhesive tape 12, so that there is no possibility that the distance between any adjacent ones of the device chips may be reduced. Accordingly, it is possible to prevent damage to the device chips due to the contact of the device chips in dividing the wafer 2 according to the present invention.

In the above preferred embodiment, the back side 5 of the wafer 2 where the devices 8 are not formed is attached to the adhesive tape 12. However, in the case of applying the laser beam to the front side 4 of the wafer 2 in the condition where the focal point of the laser beam is set inside the wafer 2, thereby forming the modified layer or the shield tunnels as the strength reduced portion 28 along each division line 6, there is a possibility that the laser beam may interfere with the devices 8. To avoid this possibility, the front side 4 of the wafer 2 is preferably attached to the adhesive tape 12, and the laser beam is preferably applied to the back side 5 of the wafer 2 in the condition where the back side 5 is oriented upward. In this case, the imaging means 20 includes an infrared CCD capable of imaging the division lines 6 from the back side 5 of the wafer 2.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for dividing a wafer into a plurality of individual device chips along a plurality of crossing division lines formed on a front side of said wafer, the front side of said wafer being partitioned by said division lines to define a plurality of separate regions where a plurality of devices are formed, said individual device chips corresponding to said respective devices, said wafer processing method comprising:

a frame supporting step of attaching said wafer to an adhesive tape fixed at its peripheral portion to an annular frame, thereby supporting said wafer through said adhesive tape to said annular frame;

a laser processing step of applying a laser beam to each division line to thereby form a strength reduced portion along each division line; and a dividing step of applying a radial tension to said adhesive tape and next applying an external force to said wafer in the condition where said radial tension is kept acting on said adhesive tape, thereby dividing said wafer into said individual device chips along said division lines, wherein said external force is applied by a metal wedge.

2. The wafer processing method according to claim 1, wherein a back side of said wafer is attached to said adhesive tape in said frame supporting step.

3. The wafer processing method according to claim 1, wherein said dividing step includes the steps of setting a first ring having a cylindrical inner surface on one side of said adhesive tape, setting a second ring having a cylindrical outer surface on the other side of said adhesive tape, said cylindrical outer surface of said second ring corresponding to said cylindrical inner surface of said first ring, and next sandwiching said adhesive tape between said cylindrical inner surface of said first ring and said cylindrical outer surface of said second ring, thereby applying said radial tension to said adhesive tape.

4. The wafer processing method according to claim 1, wherein said laser processing step includes the steps of setting the focal point of said laser beam inside said wafer, said laser beam having a transmission wavelength to said wafer, and next applying said laser beam along each division line, thereby forming a modified layer as said strength reduced portion inside said wafer along each division line.

5. The wafer processing method according to claim 1, wherein said laser processing step includes the steps of setting the focal point of said laser beam inside said wafer, said laser beam having a transmission wavelength to said wafer, and next applying said laser beam along each division line, thereby forming shield tunnels as said strength reduced portion along each division line.

6. The wafer processing method according to claim 1, wherein said laser processing step includes the steps of setting the focal point of said laser beam on the upper surface of said wafer, said laser beam having an absorption wavelength to said wafer, and next applying said laser beam along each division line, thereby forming a laser processed groove as the strength reduced portion on the upper surface of said wafer along each division line.

* * * * *